(12) United States Patent
Kim et al.

(10) Patent No.: US 12,529,951 B2
(45) Date of Patent: Jan. 20, 2026

(54) LAMINATE FOR BLANK MASK AND MANUFACTURING METHOD FOR THE SAME

(71) Applicant: SK enpulse Co., Ltd., Pyeongtaek-si (KR)

(72) Inventors: Taewan Kim, Seoul (KR); GeonGon Lee, Seoul (KR); Sukyoung Choi, Seoul (KR); Hyungjoo Lee, Seoul (KR); Suhyeon Kim, Seoul (KR); Sunghoon Son, Seoul (KR); Seongyoon Kim, Seoul (KR); Mingyo Jeong, Seoul (KR); Hahyeon Cho, Seoul (KR); Inkyun Shin, Seoul (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 509 days.

(21) Appl. No.: 17/994,739

(22) Filed: Nov. 28, 2022

(65) Prior Publication Data

US 2023/0168574 A1 Jun. 1, 2023

(30) Foreign Application Priority Data

Nov. 29, 2021 (KR) ........................ 10-2021-0166820

(51) Int. Cl.
*G03F 1/26* (2012.01)
*G03F 1/82* (2012.01)

(52) U.S. Cl.
CPC . *G03F 1/26* (2013.01); *G03F 1/82* (2013.01)

(58) Field of Classification Search
CPC ..... G03F 1/26; G03F 1/82; G03F 1/32; G03F 1/38
See application file for complete search history.

(56) References Cited

U.S. PATENT DOCUMENTS

| | | | | |
|---|---|---|---|---|
| 7,585,418 B2* | 9/2009 | Mori | ........................ | G03F 1/82 430/5 |
| 8,263,294 B2* | 9/2012 | Mori | ........................ | G03F 1/32 430/5 |
| 8,535,856 B2* | 9/2013 | Mori | ........................ | G03F 1/82 430/5 |
| 2005/0250018 A1* | 11/2005 | Ushida | ..................... | G03F 1/58 428/428 |

(Continued)

FOREIGN PATENT DOCUMENTS

| | | |
|---|---|---|
| JP | 2001-59834 A | 3/2001 |
| JP | 2006-11048 A | 1/2006 |
| JP | 2006-323360 A | 11/2006 |

(Continued)

*Primary Examiner* — Stewart A Fraser
(74) *Attorney, Agent, or Firm* — NSIP Law (57) ABSTRACT

A laminate for a blank mask includes a light-transmitting layer; a phase shift film disposed on the light-transmitting layer; and residual ions measured from a surface of the phase shift film through ion chromatography comprises at least one of sulfate ions in a concentration of 0 ng/cm² to 0.05 ng/cm², nitric oxide ions in a concentration of 0 ng/cm² to 0.5 ng/cm², or ammonium ions in a concentration of 0 ng/cm² to 5 ng/cm², or any combination thereof. A sum of concentrations of the residual ions is more than 0.

12 Claims, 1 Drawing Sheet

(56) References Cited

U.S. PATENT DOCUMENTS

2007/0215188 A1   9/2007   Kim et al.

FOREIGN PATENT DOCUMENTS

| | | |
|---|---:|---|
| JP | 4578960 B2 | 11/2010 |
| JP | 2011-59557 A | 3/2011 |
| JP | 4695732 B2 | 6/2011 |
| JP | 4863064 B2 | 1/2012 |
| JP | 2012-133343 A | 7/2012 |
| JP | 5975527 B2 | 8/2016 |
| JP | 2018-40890 A | 3/2018 |
| JP | 6367417 B2 | 8/2018 |
| KR | 10-2005-0035262 A | 4/2005 |
| KR | 10-2006-0074486 A | 7/2006 |
| KR | 10-0890409 B1 | 3/2009 |
| KR | 10-2009-0044422 A | 5/2009 |
| KR | 10-2009-0086873 A | 8/2009 |
| KR | 10-0935730 B1 | 1/2010 |
| KR | 10-2015-0122957 A | 11/2015 |
| TW | 201015628 A1 | 4/2010 |
| WO | WO 2004/059384 A1 | 7/2004 |

\* cited by examiner

LAMINATE FOR BLANK MASK AND MANUFACTURING METHOD FOR THE SAME

CROSS-REFERENCE TO RELATED APPLICATIONS

This application claims the benefit under 35 USC 119(a) of Korean Patent Application No. 10-2021-0166820 filed on Nov. 29, 2021, in the Korean Intellectual Property Office, the entire disclosure of which is incorporated herein by reference for all purposes.

BACKGROUND

1. Field

The following description relates to a laminate for a blank mask and a method for manufacturing the same.

2. Description of Related Art

Due to the high integration of semiconductor devices or the like, miniaturization of circuit patterns of semiconductor devices is desired. For this reason, the importance of a lithography technique, which is a technique for developing a circuit pattern on a wafer surface using a photomask, is being further emphasized.

For developing a miniaturized circuit pattern, a light source of exposure used in an exposure process (photolithography) may be desired to have a short wavelength. As the light source of exposure used recently, there is ArF excimer laser (wavelength of 193 nm) or the like.

A blank mask may include a light-transmitting layer, and a phase shift film or a shading film formed on the light-transmitting substrate, and the like as used. The light-transmitting layer may be manufactured through polishing and cleaning processes after shaping machining of a material having a light-transmitting characteristic is performed.

As miniaturization of a circuit pattern developed on a wafer, it may be desired to more effectively suppress defects that may occur during the manufacturing process of a blank mask and defects that may be grown during exposure. Controlling factors causing haze during exposure of a blank mask, such as sulfate ions ($SO_4^{2-}$), nitric oxide ions ($NO_2^-$ and $NO_3^-$), ammonium ions ($NH_4^+$), and chlorine ions ($Cl^-$) may be desired for preventing transcription of an undesired pattern.

The background art described above is technological information kept by inventors for deriving the present disclosure or obtained during a deriving process, and it cannot be necessarily considered as noticed technology opened to general people before application of the present disclosure.

As a related prior art, there is "Method for Formation of Photomask Suppressing Haze" disclosed in Korean Patent Registration No. 10-0935730.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a laminate for a blank mask includes a light-transmitting layer; a phase shift film disposed on the light-transmitting layer; and residual ions measured from a surface of the phase shift film through ion chromatography comprises at least one of sulfate ions in a concentration of 0 ng/cm² to 0.05 ng/cm², nitric oxide ions in a concentration of 0 ng/cm² to 0.5 ng/cm², or ammonium ions in a concentration of 0 ng/cm² to 5 ng/cm², or any combination thereof. A sum of concentrations of the residual ions is more than 0.

The residual ions may further include chlorine ions ($Cl^-$). The chlorine ions may have a concentration of 0.05 ng/cm² or less.

The phase shift film may include molybdenum, and may include any one or more elements selected from the group consisting of silicon, nitrogen, oxygen, and carbon.

The residual ions may include the sulfate ions and the nitric oxide ions.

Within the concentration of the nitric oxide ions, nitrous acid ions ($NO_2^-$) may have a concentration of 0 ng/cm² to 0.01 ng/cm², and nitric acid ions ($NO_3^-$) may have a concentration of 0 ng/cm² to 0.04 ng/cm².

In another general aspect, a manufacturing method of a laminate for a blank mask includes forming a phase shift film on a light-transmitting layer; thermally treating the phase shift film; and cleaning the thermally treated phase shift film. The forming of the phase shift film includes a nitrogen treatment operation of putting a gas having a nitrogen atmosphere of 30 volume % to 70 volume % and maintaining a concentration of ammonium ions of a surface of the phase shift film at 50 ng/cm² to 110 ng/cm². The cleaning of the thermally treated phase shift film includes a first cleaning process of adding UV rays and ozone water to the thermally treated phase shift film, and a second cleaning process of adding carbonated water and hydrogen water to the phase shift film of the first cleaning process. Residual ions measured from the surface of the phase shift film after the cleaning of the thermally treated phase shift film include at least any one of sulfate ions in a concentration of 0 ng/cm² to 0.05 ng/cm², nitric oxide ions in a concentration of 0 ng/cm² to 0.5 ng/cm², or ammonium ions in a concentration of 0 ng/cm² to 5 ng/cm², or any combination thereof. A sum of concentrations of the residual ions is more than 0.

The forming of the phase shift film may include disposing a target comprising molybdenum and silicon and operating sputtering under the atmosphere of a reactive gas. The reactive gas may include one or more selected from the group consisting of oxygen, nitrogen, and carbon.

The thermally treating of the phase shift film may proceed for a time of 10 minutes to 120 minutes at a temperature of 300° C. to 500° C.

The UV rays of the first cleaning process may be irradiated with any one wavelength of 100 nm to 250 nm in a strength of 10 mW/cm² to 100 mW/cm².

The cleaning of the thermally treated phase shift film may further include a third cleaning process of adding hydrogen water to the phase shift film after the second cleaning process.

The cleaning of the thermally treated phase shift film may further include a fourth cleaning process of adding carbonated water to the phase shift film after the third cleaning process and drying the phase shift film.

The phase shift film after the cleaning of the thermally treated phase shift film may have a decrease rate of 50% to 98% for the nitric oxide ions according to Equation 1, compared to the phase shift film after the forming of the phase shift film: [Equation 1] decrease rate (%)={(amount of nitric oxide ions after the forming of the phase shift film—amount of nitric oxide ions after the cleaning of the thermally treated phase shift film)/(amount of nitric oxide ions after the forming of the phase shift film)}×100%.

In another general aspect, a laminate for manufacturing a blank mask include a light-transmitting layer, and a phase shift film disposed on the light-transmitting layer. Residual ions measured from a surface of the phase shift film through ion chromatography include either one or both of sulfate ions in a concentration of 0 ng/cm$^2$ to 0.05 ng/cm$^2$ and nitric oxide ions in a concentration of 0 ng/cm$^2$ to 2 ng/cm$^2$, and include ammonium ions in a concentration of 50 ng/cm$^2$ to 110 ng/cm$^2$. A sum of concentrations of the sulfate ions and the nitric oxide ions is more than 0.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this application, "B being placed on A" means that B is placed in direct contact with A or placed over A with another layer or structure interposed therebetween and thus should not be interpreted as being limited to B being placed in direct contact with A.

Throughout this application, the phrase "combination(s) thereof" included in a Markush-type expression denotes one or more mixtures or combinations selected from the group consisting of components stated in the Markush-type expression, that is, denotes one or more components selected from the group consisting of the components are included.

An objective of the present disclosure is to provide a laminate for a blank mask in which ions causable growing defects during exposure have been effectively reduced.

Another objective of the present disclosure is to provide a laminate for a blank mask having a good haze characteristic and suppressed defects related to haze.

Another objective of the present disclosure is to provide a manufacturing method of a laminate for a blank mask, which can maintain the concentration of ammonium ions to a certain degree by reaction with residual hydrogen through specific nitrogen treatment during the formation of a phase shift film and can reduce ions as a factor of causing haze through the above treatment.

A laminate for a blank mask, according to an embodiment, may prevent an undesired pattern from being transcribed during an exposure process because sulfate ions, nitric oxide ions, ammonium ions, and the like have been effectively reduced in the laminate, and therefore, it may be applied as a semi-manufactured good, a finished product, and the like.

Laminate for Blank Mask

A laminate for a blank mask, according to an embodiment, may comprise, a light-transmitting layer; and a phase shift film disposed on the light-transmitting layer. The residual ions measured from the phase shift film through ion chromatography may comprise, at least any one among sulfate ions in a concentration of 0 ng/cm$^2$ to 0.05 ng/cm$^2$, nitric oxide ions in a concentration of 0 ng/cm$^2$ to 0.5 ng/cm$^2$, and ammonium ions in a concentration of 0 ng/cm$^2$ to 5 ng/cm$^2$. A sum of the concentrations of the residual ions may be more than 0.

The light-transmitting layer may be composed of materials with a light-transmitting characteristic with respect to exposure lights with a wavelength of 193 and 248 nm having a light source, such as argon fluoride (ArF) and krypton fluoride (KrF). As the light-transmitting layer, soda lime, quartz glass, or calcium fluoride may be used, and for example, the material for the light-transmitting layer may be quartz glass.

The light-transmitting layer may have a transmittance of at least 85% or more, and less than or equal to 100% for a laser with the wavelength of 193 nm having a light source of argon fluoride (ArF).

The phase shift film is a thin film of attenuating the light strength of an exposure light, regulating a retardation, and thereby substantially suppressing a diffraction light generated at the edge of a pattern of a photomask.

The phase shift film may comprise molybdenum, and may comprise any one or more elements selected from the group consisting of silicon, nitrogen, oxygen, and carbon, and for example, may comprise MoSi, MoSiN, MoSiO, MoSiC, MoSiCN, MoSiCO, MoSiON, MoSiCON, and the like. MoSi is a phase shift film containing Mo and Si.

When the phase shift film comprises at least MoSi, the phase shift film may comprise, molybdenum in an amount of 0.001 at % to 10 at %; and silicon in an amount of 20 at % to 99 at %; or may comprise nitrogen in an amount of 0.001 at % to 65 at %; oxygen in an amount of 0.1 at % to 20 at %; and carbon in an amount of 0.001 at % to 20 at %.

Also, the phase shift film may comprise, molybdenum in an amount of 0.001 at % to 5.5 at %; and silicon in an amount of 25 at % to 98 at %; or may comprise nitrogen in an amount of 0.001 at % to 60 at %; oxygen in an amount of 1.0 at % to 30 at %; and carbon in an amount of 0.001 at % to 15 at %.

The phase shift film may have a thickness of about 15 nm to 90 nm.

The phase shift film may have a transmittance of 1% to 30%, and a transmittance of 3% to 10% for a laser with the wavelength of 193 nm having a light source of argon fluoride (ArF). Also, the phase shift film may have a retardation of 170° to 190°, or 175° to 185° with respect to a laser with the wavelength of 193 nm having a light source of argon fluoride (ArF). In such a case, when the laminate for a blank mask is utilized as a photomask, the resolution thereof may be improved.

The surface of the phase shift film may have an amount of residual ions measured through ion chromatography. The detailed process of measuring the amount of residual ions through the ion chromatography is described in the experiment example below and the like.

The phase shift film may have a state of reduced nitric oxide or sulfate ions caused by ammonium ions formed to have a certain concentration by intentionally inducing a reaction with residual hydrogen through specific nitrogen treatment for an embodiment during film formation.

Within the residual ions of the phase shift film, sulfate ions may have a concentration of 0 ng/cm$^2$ to 0.05 ng/cm$^2$, 0.001 ng/cm$^2$ to 0.03 ng/cm$^2$, 0.001 ng/cm$^2$ to 0.02 ng/cm$^2$, or 0.001 ng/cm$^2$.

For the concentration of the residual ions, specifically, nitrous acid ions ($NO_2^-$) may have a concentration of 0 ng/cm$^2$ to 0.01 ng/cm$^2$, nitric acid ions ($NO_3^-$) may have a concentration of 0 ng/cm$^2$ to 0.04 ng/cm$^2$, or the nitrous acid ions ($NO_2^-$) may have a concentration of 0 ng/cm$^2$ to 0.005 ng/cm$^2$, and the nitric acid ions ($NO_3^-$) may have a concentration of 0.001 ng/cm$^2$ to 0.03 ng/cm$^2$.

Within the residual ions of the phase shift film, ammonium ions may have a concentration of 0 ng/cm$^2$ to 5 ng/cm$^2$, or 0.001 ng/cm$^2$ to 3 ng/cm$^2$.

Within the residual ions of the phase shift film, chlorine ions ($Cl^-$) may be comprised in a concentration of 0 ng/cm$^2$ to 0.05 ng/cm$^2$, or may be comprised in a concentration of 0.001 ng/cm$^2$ to 0.03 ng/cm$^2$.

The phase shift film may be in the state of rarely having ions causable growing defects due to specific nitrogen treatment during film formation of an embodiment described below. Because the phase shift film has such a concentration of residual ions, it can effectively suppress the occurrence of growing defects during an exposure process when applied as a photomask.

Figure 1:
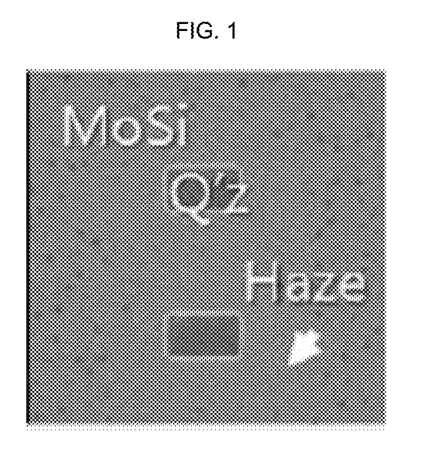
FIG. 1 is a photograph taken through a Scanning Electron Microscope (SEM) of the surface of a phase shift film (MoSi) having an intagliated pattern allowing a light-transmitting layer (Q'z) to be partially exposed and growing haze, in the experiment examples.
Figure 2:
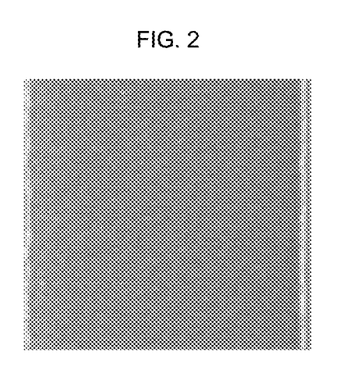
FIG. 2 is a photograph taken through a Scanning Electron Microscope (SEM) of the surface of a phase shift film, excluding a growing defect, in the experiment examples.

When a light with the wavelength of 193 nm is irradiated in the phase shift film for 120 minutes, growing defects may be present in a distribution of 0.01 piece/cm$^2$ or less, or growing defects may not occur and not be detected. The irradiation of a light with the wavelength of 193 nm may be performed under the condition of accumulated exposure light energy of 10 kJ, the temperature of 23° C., and the relative humidity of 45% through UV particle accelerator. The growing defects may be generated having a black spot shape of about 50 nm on the surface of the phase shift film, and the number may be measured by ascertainment with Scanning Electron Microscope (SEM) and the like, as illustrated in FIG. 1. When a growing defect is not generated, a black spot shape of 50 nm or less may not be found by ascertainment with Scanning Electron Microscope (SEM) as illustrated in FIG. 2. The phase shift film may have residual ions controlled to have a certain concentration on the surface, and may exhibit a good degree in the number of growing defects during exposure.

The laminate for a blank mask may further comprise a shading film disposed on the phase shift film.

The shading film may comprise a transition metal comprising any one or more selected from the group consisting of chrome, tantalum, titanium, and hafnium, and one or more nonmetal elements selected from the group consisting of oxygen, nitrogen, and carbon.

The shading film may comprise any one or more selected from the group consisting of CrO, CrON, CrOCN, and combinations thereof.

The shading film may have a multilayer structure, or may have a double-layer structure. For example, the surface layer of the shading film may be formed to allow oxygen or nitrogen to have an increased amount in the surface direction of the shading film, in order to control the surface strength of the shading film and the like. The remaining portion of the shading film excluding the surface layer is referred to as a lower layer of the shading film, in order to distinguish it from the surface layer of the shading layer.

The surface layer of the shading film may have a thickness of 30 nm to 80 nm, or 40 nm to 70 nm. The lower layer of the shading film to the surface layer of the shading film may have a thickness ratio of 1:0.02 to 0.25, or 1:0.04 to 1:0.18.

The shading film may have a reflectance of about 35% or less, or about 30% or less with respect to a laser with the wavelength of 193 nm having a light source of argon fluoride (ArF). The reflectance may be about 20% or more, about 23% or more, or about 25% or more.

The laminate for a blank mask may prevent an undesired pattern from being transcribed during an exposure process by reduction of sulfate ions, nitric oxide ions, ammonium ions, and the like, and therefore, may be used as semi manufactured goods, a finished product, and the like.

Laminate for Manufacturing Blank Mask

A laminate for manufacturing a blank mask, according to an embodiment, may comprise, a light-transmitting layer; and a phase shift film disposed on the light-transmitting layer. Residual ions measured at the surface of the phase shift film through ion chromatography may comprise, at least any one between sulfate ions in a concentration of 0 $ng/cm^2$ to 0.05 $ng/cm^2$, and nitric oxide ions in a concentration of 0 $ng/cm^2$ to 2 $ng/cm^2$, and may comprise ammonium ions in a concentration of 50 $ng/cm^2$ to 110 $ng/cm^2$, a sum of concentrations of the sulfate ions and nitric oxide ions may be more than 0.

The laminate for manufacturing the blank mask may be one manufactured through nitrogen treatment, and may be one to which thermal treatment and cleaning treatment have not proceeded after the nitrogen treatment.

The light-transmitting layer of the laminate for manufacturing a blank mask is the same as described in the laminate for a blank mask, and thus the overlapped description is omitted.

The composition, thickness, and the like of the phase shift film of the laminate for manufacturing a blank mask are the same as described in the laminate for a blank mask, and thus the overlapped description is omitted.

Within the residual ions of the phase shift film, sulfate ions may have a concentration of 0.001 $ng/cm^2$ to 0.05 $ng/cm^2$, 0.001 $ng/cm^2$ to 0.03 $ng/cm^2$, 0.001 $ng/cm^2$ to 0.02 $ng/cm^2$, or 0.001 $ng/cm^2$ to 0.01 $ng/cm^2$, Within the residual ions of the phase shift film, nitric oxide ions may have a concentration of 0.001 $ng/cm^2$ to 0.05 $ng/cm^2$, 0.001 $ng/cm^2$ to 0.03 $ng/cm^2$, 0.001 $ng/cm^2$ to 0.02 $ng/cm^2$, or 0.001 $ng/cm^2$ to 0.01 $ng/cm^2$.

For the concentration of the nitric oxide ions, specifically, nitrous ions ($NO_2^-$) may have a concentration of 0 $ng/cm^2$ to 0.3 $ng/cm^2$, and nitric ions ($NO_3^-$) may have a concentration of 0 $ng/cm^2$ to 1 $ng/cm^2$, or the nitrous ions ($NO_2^-$) may have a concentration of 0.001 $ng/cm^2$ to 0.1 $ng/cm^2$, and the nitric ions ($NO_3^-$) may have a concentration of 0.001 $ng/cm^2$ to 0.3 $ng/cm^2$, Within the residual ions of the phase shift film, ammonium ions may have a concentration of 50 $ng/cm^2$ to 110 $ng/cm^2$, or 60 $ng/cm^2$ to 100 $ng/cm^2$.

The residual ions of the phase shift film may comprise chlorine ions (Cl) in a concentration of 0.001 $ng/cm^2$ to 0.05 $ng/cm^2$, or in a concentration of 0.001 $ng/cm^2$ to 0.03 $ng/cm^2$.

The phase shift film may be in the state of rarely having ions causable growing defects due to specific nitrogen treatment during film formation of an embodiment described below. Because the phase shift film has such a concentration of residual ions, it can effectively suppress the occurrence of growing defects during an exposure process when applied as a photomask.

Manufacturing Method of Laminate for Blank Mask

A manufacturing method of a laminate for a blank mask, according to an embodiment, may comprise, a film formation operation of forming a phase shift film on a light-transmitting layer; a thermal treatment operation of thermally treating the phase shift film; and a cleaning operation of cleaning the thermally treated phase shift film. The film formation operation may comprise a nitrogen treatment operation of putting a gas to have a nitrogen atmosphere of 30 volume % to 70 volume % and maintaining the concentration of ammonium ions of the film surface to be formed at a concentration of 50 $ng/cm^2$ to 110 $ng/cm^2$, the cleaning operation may comprise a first cleaning process of adding UV rays and an ozone water to the thermally treated phase shift film and a second cleaning process of adding a carbonated water and a hydrogen water to the phase shift film to which the first cleaning process has proceeded. The residual ions measured from the surface of the phase shift film to which the cleaning operation has proceeded may comprise, at least any one among sulfate ions in a concentration of 0 $ng/cm^2$ to 0.05 $ng/cm^2$, nitric oxide ions in a concentration of 0 $ng/cm^2$ to 0.5 $ng/cm^2$, and ammonium ions in a concentration of 0 $ng/cm^2$ to 5 $ng/cm^2$, wherein a sum of the concentrations of residual ions may be more than 0.

The film formation operation may be performed by disposing a target comprising molybdenum and silicon and operating sputtering under the atmosphere of a reactive gas, wherein the reactive gas may comprise one or more selected from the group consisting of oxygen, nitrogen, and carbon. For example, the sputtering may be DC magnetron sputtering or RF sputtering.

The sputtering of the film formation operation may proceed as a process of, i) disposing a target and a supporting unit (light-transmitting layer) inside a chamber and injecting an atmosphere gas into the chamber, ii) applying an electric power to a sputtering apparatus, and iii) forming a film on the supporting unit by transition metal particles dislocated from the target together with oxygen, nitrogen, or carbon comprised in the reactive gas.

The dislocation of target particles in the sputtering of the film formation operation may be performed by a sputtering gas. The sputtering gas refers to a gas ionizing in a plasma atmosphere to collide with a target. For example, the sputtering gas may be an argon (Ar) gas.

The reactive gas of the film formation operation may be nitrogen, oxygen, carbon monoxide, carbon dioxide, nitrous oxide, nitric oxide, nitrogen dioxide, ammonia, methane, and for example, nitrogen and oxygen may be comprised in the reactive gas.

In the sputtering of the film formation operation, the vacuum degree in the chamber may be equal to or more than $10^{-1}$ Pa and less than or equal to $10^{-4}$ Pa or less. In such a vacuum degree, the accelerated energy of particles to be sputtered can be properly regulated and stability of film formation can be secured.

In the sputtering of the film formation operation, the sputtering gas may have a flow amount of 5 sccm to 100 sccm, 50 sccm or less, or 20 sccm or less. The reactive gas may hay a flow amount of 5 sccm to 200 sccm, or 150 sccm or less. For example, within the reactive gas, nitrogen ($N_2$) gas may have a flow amount of 10 sccm to 120 sccm, or 30 sccm to 90 sccm. Though helium gas does not have reactivity but may be comprised as some of the reactive gas, and the helium gas may have a flow amount of 10 sccm to 100 sccm, or 20 sccm to 60 sccm.

In the sputtering of the film formation operation, the reactive gas may comprise nitrogen in an amount of 30 volume % to 70 volume %, or 50 volume % to 70 volume %.

In the sputtering of the film formation operation, the nitrogen treatment process accelerate reaction with hydrogen ($H_2$) in the chamber during film formation and intentionally allows ammonium ions on the film surface where film formation is made to have a predetermined concentration. A process of generating nitric oxide through a reaction of oxygen gas and nitrogen gas that may be comprised in the reactive gas is an involuntary endothermic reaction, and a process of generating ammonium ions through nitrogen gas and hydrogen is a spontaneous heat generation reaction. In a closed sphere like a chamber, nitrogen gas may cause a reaction with hydrogen having priority. Such a hydrogen may remain due to cleaning of a light-transmitting layer, and separate treatment with hydrogen water may be performed to the light-transmitting layer to have hydrogen in a predetermined amount for maintaining the concentration of ammonium ions present thereon.

The film formation operation can temporarily increase the concentration of ammonium ions to have an amount of 50 ng/cm$^2$ to 110 ng/cm$^2$, through the nitrogen treatment under the above condition, and can easily reduce sulfate ions, nitric oxide ions, and the like that may remain through subsequent operations. Also, the nitrogen treatment can regulate the ammonium ions to have a concentration of 60 ng/cm$^2$ to 100 ng/cm$^2$. In the sputtering of the film formation operation, the composition ratio of a target may be Mo in an amount of 5 at % to 20 at %, Si in an amount of 70 at % to 97 at %, carbon in an amount of 50 ppm to 230 ppm, and oxygen in an amount of 400 ppm to 800 ppm.

The electric power applied to the sputtering of the film formation operation may be equal to or more than 0.1 kW and less than or equal to 4 kW.

The thermal treatment operation may proceed for a time of 10 minutes to 120 minutes at a temperature of 300° C. to 500° C.

The thermal treatment operation may comprise a process of cooling treatment for a time of 10 minutes to 60 minutes at a temperature of 20° C. to 30° C. after the thermal treatment.

Ammonium ions and nitric oxide ions can be effectively reduced through the thermal treatment operation.

The cleaning operation may comprise a first cleaning process of adding UV ray and an ozone water to the phase shift film to which the thermal treatment operation has proceeded and a second cleaning process of adding a carbonated water and a hydrogen water to the phase shift film to which the first cleaning process has proceeded.

The UV rays of the first cleaning process of the cleaning operation may be irradiated in a wavelength of 100 nm to 250 nm, a strength of 10 mW/cm$^2$ to 100 mW/cm$^2$, and a time of 20 seconds to 160 seconds, or may be irradiated the phase shift film in a strength of 20 mW/cm$^2$ to 80 mW/cm$^2$ and a time of 30 seconds to 140 seconds.

The UV irradiation of the first cleaning process of the cleaning operation may proceed under the condition of an atmosphere having a flow ratio of 1:1 to 1:10 for oxygen to nitrogen, a temperature of 15° C. to 35° C., and a degassing pressure of 0.1 kPa to 0.75 kPa.

The first cleaning process of the cleaning operation may be performed by adding an ozone water to the phase shift film. The ozone water may be one mixed with ozone and ultra-pure water.

The ozone water of the first cleaning process of the cleaning operation may have a concentration of 48 ppm to 155 ppm, or 77 ppm to 124 ppm, based on the volume.

In the first cleaning process of the cleaning operation, UV treatment and ozone water treatment may be performed simultaneously or in the order of UV-ozone water or ozone water-UV.

In the first cleaning process of the cleaning operation, the UV treatment may be performed through plural UV lamp, and the ozone water treatment may be performed through plural nozzles for supplying ozone water. For example, two to ten UV lamps may be applied, and two to ten nozzles may be applied.

In the second cleaning process of the cleaning operation, the carbonated water may be one mixed from carbon and ultra-pure water, and the hydrogen water may be one mixed from a hydrogen molecule and ultra-pure water.

In the second cleaning process of the cleaning operation, the carbonated water may have an electric conductivity of 2 μS/cm to 10 μS/cm, or 2 μS/cm to 8 μS/cm. Also, in the second cleaning process of the cleaning operation, the hydrogen water may have a concentration of 0.5 ppm to 3 ppm, or 0.8 ppm to 2.4 ppm based on the volume.

The second cleaning process of the cleaning operation may be processed in an order of carbonated water-hydrogen water or hydrogen water-carbonated water, or may be processed by a mixture of carbonated water and hydrogen water.

The second cleaning process of the cleaning operation may also operate megasonic treatment further together with the carbonated water and hydrogen water treatment, and may be performed in an output of 2 W to 15 W and a frequency of 0.2 MHz to 3 MHz.

The cleaning operation may comprise a third cleaning process of adding a hydrogen water to the phase shift film to which the second cleaning process has proceeded.

In the third cleaning process of the cleaning operation, the hydrogen water may have a concentration of 0.5 ppm to 3 ppm, or 0.8 ppm to 2.4 ppm.

The third cleaning process of the cleaning operation may also operate megasonic treatment further together with the hydrogen water treatment, and may be performed in an output of 5 W to 20 W and a frequency of 0.2 MHz to 3 MHz.

The cleaning operation may comprise a fourth cleaning process of adding a carbonated water once more to the phase shift film to which the third cleaning process has proceeded and dry the phase shift film.

In the fourth cleaning process of the cleaning operation, the carbonated water may have an electric conductivity of 2 μS/cm to 10 μS/cm, or 2 μS/cm to 8 μS/cm.

In the fourth cleaning process of the cleaning operation, drying may be performed by Ramp-up method of placing and fixing a laminate for a blank mask on a rotating mean and increasing the rotation speed to the target. The rotation speed may be gradually increased from an initial speed of 30 rpm to 100 rpm, to a speed of 1000 rpm to 1800 rpm. The phase shift film to which the cleaning operation has proceeded may have a decrease rate of 50% to 98%, or 70% to 99% for nitric oxide ions according to Equation 1 below, compared to the phase shift film to which the film formation operation has proceeded. At this time, the decrease rate of ions is based on a weight unit.

Decrease Rate (%)={(The Amount of Nitric Oxide Ions after Film Formation Operation−The Amount of Nitric Oxide Ions after Cleaning Operation)/(The Amount of Nitric Oxide Ions after Film Formation Operation)}×100%  [Equation 1]

The amount of residual ions of the phase shift film to which the cleaning operation has proceeded is the same as described in the laminate for a blank mask, and thus the overlapped description is omitted.

The cleaning operation may be performed by substantially not comprising sulfuric acid or ammonia water. Accordingly, chemical residuum derived from sulfuric acid or ammonia water can be prevented from remaining on the surface of the phase shift film.

The manufacturing method of a laminate for a blank mask may comprise a rear surface cleaning operation of cleaning a rear surface as one surface of the light-transmitting layer prepared for the formation of a phase shift film, before the formation of the phase shift film.

The rear surface cleaning operation may comprise a first rear surface cleaning process of adding UV rays and an ozone water to the rear surface, a second rear surface cleaning process of adding SC-1 solution and an ozone water to the rear surface to which the first rear surface cleaning process has proceeded, and a third rear surface cleaning process of adding a carbonated water to the rear surface to which the second rear surface cleaning process has proceeded.

The UV rays of the first rear surface cleaning process of the rear surface cleaning process may be irradiated the rear surface in a wavelength of 100 nm to 250 nm, a strength of 10 mW/cm$^2$ to 100 mW/cm$^2$, and a time of 20 seconds to 160 seconds, or may be irradiated the rear surface in a strength of 20 mW/cm$^2$ to 80 mW/cm$^2$, and a time of 30 seconds to 140 seconds.

The UV irradiation of the first rear surface cleaning process of the rear surface cleaning operation may be performed under the condition of a flow ratio of 1:1 to 1:10 for oxygen to nitrogen, a temperature of 15° C. to 35° C., and a degassing pressure of 0.1 kPa to 0.75 kPa.

The first rear surface cleaning process of the rear surface cleaning operation may be operated by adding an ozone water to the rear surface. The ozone water may be one mixed from ozone and ultra-pure water.

The ozone water of the first rear surface cleaning process of the rear surface cleaning operation may have a concentration of 48 ppm to 155 ppm, or 77 ppm to 124 ppm based on the volume.

In the first rear surface cleaning process of the rear surface cleaning operation, UV treatment and ozone water treatment may be performed simultaneously or in an order of UV-ozone water or ozone water-UV.

In the first rear surface cleaning process of the rear surface cleaning operation, UV treatment may be performed by plural UV lamp, and for example, two to ten UV lamp may be applied.

The SC-1 (Standard Clean-1) solution of the second rear surface cleaning process of the rear surface cleaning operation may be one among standard cleaning solutions manufactured by RCA Laboratories, may be one in which ammonia and hydrogen peroxide have been comprised in a volume ratio of 1:0.2 to 1:1.4, and may be one in which deionized water has been comprised in an amount of 99% to 99.9% based on the whole volume.

The ozone water of the second rear surface cleaning process of the rear surface cleaning operation may have a concentration of 48 ppm to 155 ppm, or 77 ppm to 124 ppm based on the volume.

In the second rear surface cleaning process of the rear surface cleaning operation, the SC-1 solution treatment and ozone water treatment may be performed at the same time, and may be performed in an order of SC-1 solution-ozone water or ozone water-SC-1 solution. When the SC-1 solution treatment and ozone water treatment proceed at the same time, they may be performed through plural nozzles, and the number of the nozzles may be equal to or more than 2 and less than or equal to 10.

The second rear surface cleaning process of the rear surface cleaning operation may operate megasonic treatment further together with the SC-1 solution and ozone water treatment, and may be performed in an output of 10 W to 80 W and a frequency of 0.5 MHz to 5 MHz.

The carbonated water of the third rear surface cleaning process of the rear surface cleaning operation may have an electric conductivity of 2 µS/cm to 10 µS/cm, or 2 µS/cm to 8 µS/cm.

The rear surface cleaning operation may comprise a drying process of drying the rear surface treated by the third rear surface cleaning process, and may be performed by Ramp-up method of placing and fixing a laminate for a blank mask on a rotation mean in an inert atmosphere and increasing the rotation speed to the target. The rotation speed may be gradually increased from an initial rate of 30 rpm to 100 rpm to a rate of 100 rpm to 1800 rpm.

Hereinafter, the present disclosure will be described in further detail with reference to accompanying examples. The following embodiments are only examples for understanding the present disclosure, and the range of the present disclosure is not limited to the same.

<Example 1-A> Film Formation of Phase Shift Film Comprising Nitrogen Treatment

A light-transmitting layer of quartz glass with a sectional area of 504 cm$^2$ and a thickness of 0.25 inches and a target whose composition ratio is Mo of 10.75 at % and Si of 89.25 at % were disposed in DC magnetron sputtering apparatus. At this time, the target was disposed to have an angle of 30 to 50 degrees and the distance of 255 mm between the light-transmitting layer and the target.

Film formation through sputtering was performed while the electric power of 2 kW was applied, a gas was injected, and simultaneously a light-transmitting layer was rotated. During the film formation, while nitrogen ($N_2$) gas of 70 volume % and argon gas of a residual amount were maintained when injected, ammonium ions at the surface was disposed to have a concentration of 50 ng/cm$^2$ to 110 ng/cm$^2$ and thereby a laminate for a blank mask comprising a phase shift film was prepared.

<Example 1-B> Thermal Treatment of Phase Shift Film

For the laminate for a blank mask to which the Example 1-A had proceeded, thermal treatment was performed for 40 minutes at a temperature of 400° C., and subsequently, cooling treatment was performed for 40 minutes at a temperature of 25° C.

<Example 1-C> Cleaning of Phase Shift Film

The UV rays were irradiated to the laminate for a blank mask to which the Example 1-B had proceed under the following conditions. In an atmosphere with an oxygen: nitrogen flow rate of 1:5, and a temperature of 23° C., the UV rays with a wavelength of 172 nm were uniformly irradiated at 40 mW/cm². Simultaneously, ozone water with a concentration of 100 ppm based on the volume was added for cleaning treatment; thereby, pollution could be easily removed in subsequent processes.

After that, carbonated water with an electric conductivity of 4.5 μS/cm and hydrogen water with a hydrogen concentration of 1.25 ppm were added in the volume ratio of 1:1, and simultaneously a high frequency with the condition of 6.5 W and 1 MHz was also added for cleaning treatment.

After that, hydrogen water having a concentration of 1.25 ppm based on the volume was added, and a high frequency with the condition of 10 W and 1 MHz was also added for cleaning treatment.

After that, carbonated water having an electric conductivity of 4.5 μS/cm was added, and the rotation speed of a rotation means in which a laminate for a blank mask had been placed was gradually increased for drying thereof.

<Comparative Example 1-A> Film Formation of Phase Shift Film

In Example 1-A, the partial pressure of nitrogen was lowered to be less than 30 volume % not to maintain the concentration of ammonium ions at the surface, and thereby a laminate for a blank mask comprising a phase shift film was prepared.

<Comparative Example 1-B> Thermal Treatment of Phase Shift Film

The laminate manufactured in Comparative Example 1-A was thermally treated under the same condition as Example 1-B.

<Comparative Example 1-C> Cleaning of Phase Shift Film

The laminate thermally treated in Comparative Example 1-B was cleaned under the same condition as Example 1-C.

Experiment Example—Analysis of Ion Chromatography

For the laminate samples for a blank mask obtained from Example 1-A to Example 1-C and Comparative Example 1-A to Comparative Example 1-C, ion chromatography analysis of the surface of the phase shift film was performed through a Dionex ICS-2100 Ion Chromatography model available from ThermoScientific corporation as follows.

First, each laminate for a blank mask was put into a clean bag, and ultrapure water of 100 ml was injected into the clean bag. The clean bag was digested for 120 minutes in a water tank at 90° C., and after that an ion-leached solution was obtained from the clean bag. Thereafter, an ion-leached solution and an eluent were injected into an ion chromatography column to analyze ion chromatography, and the weight by ions was measured. The amount of each ion was divided into the surface area (504 cm²) of the substrate and the amount by ions was calculated.

When ion chromatography was measured, a solution comprising KOH, LiOH, MSA (methanesulfonic acid), and NaOH was applied as an eluent, and the flux on movement was applied to be a value of 0.4 mL/min to 2.0 mL/min.

The amount of residual ions measured through ion chromatography of each Example or Comparative Example is shown in table 1 below.

TABLE 1

| Index | Whether Nitrogen Treatment was Performed | $Cl^-$ | $NO_2^-$ | $NO_3^-$ | $SO_4^{2-}$ | $NH_4^+$ | Suppressing Effect of $NO_x$ |
|---|---|---|---|---|---|---|---|
| Example 1-A | Performed | 0.02 | 0.09 | 0.28 | 0.01 | 81.99 | Effective |
| Example 1-B | Performed | 0.01 | 0.01 | 0.08 | 0.02 | 10.25 | Effective |
| Example 1-C | Performed | 0.01 | 0.00 | 0.02 | 0.02 | 1.90 | Effective |
| Comparative Example 1-A | Not Performed | 0.03 | 25.21 | 78.45 | 0.11 | 37.72 | Ineffective |
| Comparative Example 1-B | Not Performed | 0.02 | 2.80 | 22.41 | 0.12 | 4.72 | Ineffective |
| Comparative Example 1-C | Not Performed | 0.02 | 1.42 | 5.61 | 0.12 | 0.97 | Ineffective |

Unit: ng/cm²

F, Acetate, Formate, PO4, Oxalate, Na, K, Mg, and Ca ions were not detected in all Examples and Comparative Examples.

With reference to Table 1, the result of ion measurement was verified as follows: Examples 1-A, 1-B, and 1-C processed by nitrogen treatment had the sum of $NO_x$ ions reduced to be about 0.5 ng/cm² or less, and all Comparative Examples unprocessed by nitrogen treatment had a sum of NOx ions of about 6 ng/cm² or more. For concentrations of sulfate ions and chlorine ions, Examples were also shown to have a lower value than Comparative Examples.

This is thought to be the result of nitrogen treatment made in Examples, which maintains the concentration of ammonium ions at the surface to be a certain concentration and simultaneously suppresses the generation of nitric oxide ions and the like. Example 1-C, to which all the film formation, thermal treatment, and cleaning have proceeded, was verified as having effectively reduced values of all the ammonium ions, nitric oxide ions, sulfate ions, and chlorine ions causable growing defects.

Experiment Example—Measurement of Growing Defects

On the surface of the phase shift film of each laminate sample for a blank mask obtained from Example 1-C and Comparative Example 1-C, an intagliated pattern was formed in an ordinary etching method, allowing a light-transmitting layer to be partially exposed. After that, a light with the wavelength of 193 nm was irradiated to the surface of the phase shift film of each sample through a UV particle accelerator under the condition which was a temperature of 23° C. and a relative humidity of 45% for 120 minutes. Thereafter, the photograph for the state of the surface of each sample was taken through Scanning Electron Microscope (SEM), the photographic result of Comparative 1-C was shown in FIG. 1, and the photographic result of Example 1-C was shown in FIG. 2.

With reference to FIG. 1, in the case of Comparative Example 1-C in which nitric oxide ions and sulfur oxide ions remained on the surface of the phase shift film in a certain concentration, it was confirmed that plural black spots of 50 nm or less that were growing defects were shown after exposure.

With reference to FIG. 2, in the case of Example 1-C in which nitric oxide ions and sulfur oxide ions were extremely restrained, it was confirmed that a growing defect was not shown after exposure.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A laminate for a blank mask comprising:
    a light-transmitting layer;
    a phase shift film disposed on the light-transmitting layer; and
    residual ions measured from a surface of the phase shift film through ion chromatography comprises at least one of sulfate ions in a concentration of 0 ng/cm² to 0.05 ng/cm², nitric oxide ions in a concentration of 0 ng/cm² to 0.5 ng/cm², or ammonium ions in a concentration of 0 ng/cm² to 5 ng/cm², or any combination thereof,
    wherein a sum of concentrations of the residual ions is more than 0, and
    wherein the residual ions comprise the sulfate ions and the nitric oxide ions.

2. The laminate of claim 1,
    wherein the residual ions further comprise chlorine ions (Cl⁻), and
    wherein the chlorine ions have a concentration of 0.05 ng/cm² or less.

3. The laminate of claim 1,
    wherein the phase shift film comprises molybdenum, and comprises any one or more elements selected from the group consisting of silicon, nitrogen, oxygen, and carbon.

4. The laminate of claim 1,
    wherein within the concentration of the nitric oxide ions, nitrous acid ions ($NO_2^-$) have a concentration of 0 ng/cm² to 0.01 ng/cm², and
    nitric acid ions ($NO_3^-$) have a concentration of 0 ng/cm² to 0.04 ng/cm².

5. A manufacturing method of a laminate for a blank mask comprising:
    forming a phase shift film on a light-transmitting layer;
    thermally treating the phase shift film; and
    cleaning the thermally treated phase shift film,
    wherein the forming of the phase shift film comprises a nitrogen treatment operation of applying a gas having 30 volume % to 70 volume % of nitrogen gas and maintaining a concentration of ammonium ions of a surface of the phase shift film at 50 ng/cm² to 110 ng/cm²,
    wherein the cleaning of the thermally treated phase shift film comprises a first cleaning process of adding UV rays and ozone water to the thermally treated phase shift film, and a second cleaning process of adding carbonated water and hydrogen water to the phase shift film of the first cleaning process,
    wherein residual ions measured from the surface of the phase shift film after the cleaning of the thermally treated phase shift film comprise
    at least any one of sulfate ions in a concentration of 0 ng/cm² to 0.05 ng/cm²,
    nitric oxide ions in a concentration of 0 ng/cm² to 0.5 ng/cm², or
    ammonium ions in a concentration of 0 ng/cm² to 5 ng/cm², or any combination thereof, and
    wherein a sum of concentrations of the residual ions is more than 0.

6. The manufacturing method of claim 5,
    wherein the forming of the phase shift film comprises disposing a target comprising molybdenum and silicon and operating sputtering under the atmosphere of a reactive gas, and
    wherein the reactive gas comprises one or more selected from the group consisting of oxygen, nitrogen, and carbon.

7. The manufacturing method of claim 5,
    wherein the thermally treating of the phase shift film proceeds for a time of 10 minutes to 120 minutes at a temperature of 300° C. to 500° C.

8. The manufacturing method of claim 5,
    wherein the UV rays of the first cleaning process are of any one wavelength of 100 nm to 250 nm irradiated in a strength of 10 mW/cm² to 100 mW/cm².

9. The manufacturing method of claim 5,
    wherein the cleaning of the thermally treated phase shift film further comprises
    a third cleaning process of adding hydrogen water to the phase shift film after the second cleaning process.

10. The manufacturing method of claim 9,
    wherein the cleaning of the thermally treated phase shift film further comprises
    a fourth cleaning process of adding carbonated water to the phase shift film after the third cleaning process and drying the phase shift film.

11. The manufacturing method of claim 5,
    wherein the phase shift film after the cleaning of the thermally treated phase shift film has a decrease rate of 50% to 98% for the nitric oxide ions according to Equation 1, compared to the phase shift film after the forming of the phase shift film:

decrease rate (%)={(amount of nitric oxide ions after the forming of the phase shift film−amount of nitric oxide ions after the cleaning of the thermally treated phase shift film)/(amount of nitric oxide ions after the forming of the phase shift film)}×100%.   [Equation 1]

12. A laminate for manufacturing a blank mask comprising,
a light-transmitting layer; and
a phase shift film disposed on the light-transmitting layer,
wherein residual ions measured from a surface of the phase shift film through ion chromatography comprise
either one or both of sulfate ions in a concentration of 0 ng/cm$^2$ to 0.05 ng/cm$^2$ and
nitric oxide ions in a concentration of 0 ng/cm$^2$ to 2 ng/cm$^2$, and
comprise ammonium ions in a concentration of 50 ng/cm$^2$ to 110 ng/cm$^2$, and
wherein a sum of concentrations of the sulfate ions and the nitric oxide ions is more than 0.

* * * * *